(12) United States Patent
Janzen et al.

(10) Patent No.: US 7,035,159 B2
(45) Date of Patent: Apr. 25, 2006

(54) TECHNIQUES FOR STORING ACCURATE OPERATING CURRENT VALUES

(75) Inventors: Jeffery W. Janzen, Meridian, ID (US); Scott Schaefer, Boise, ID (US); Todd D. Farrell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 127 days.

(21) Appl. No.: 10/816,424

(22) Filed: Apr. 1, 2004

(65) Prior Publication Data

US 2005/0249013 A1 Nov. 10, 2005

(51) Int. Cl.
*G11C 17/18* (2006.01)

(52) U.S. Cl. ............... 365/225.7; 365/230.03; 365/63

(58) Field of Classification Search ............ 365/225.7, 365/230.03, 63
See application file for complete search history.

(56) References Cited

U.S. PATENT DOCUMENTS 6,842,369 B1 * 1/2005 Koll et al. ............... 365/63
6,947,303 B1 * 9/2005 Schnell ..................... 365/225.7

OTHER PUBLICATIONS

Authors: Jeffery W. Janzen, Scott Schaefer, Todd D. Farrell; Title: Memory Modules Having Accurate Operating Current Values Stored Thereon and Methods for Fabricating and Implementing Such Devices; U.S. Appl. No. 10/816,239, filed Apr. 1, 2004.
Authors: Jeffery W. Janzen, Scott Schaefer, Todd D. Farrell; Title: Techniques for Implementing Accurate Operating Current Values Stored in a Database; U.S. Appl. No. 10/816,241, filed Apr. 1, 2004.

* cited by examiner

*Primary Examiner*—Huan Hoang
(74) *Attorney, Agent, or Firm*—Fletcher Yoder

(57) ABSTRACT

A technique for storing accurate operating current values using programmable elements on memory devices. More specifically, programmable elements, such as antifuses, located on a memory device are programmed with measured operating current values corresponding to the memory device, during fabrication. The memory device may be incorporated into a memory module that is incorporated into a system. Once the memory module is incorporated into a system, the programmable elements may be accessed such that the system can be configured to optimally operate in accordance with the operating current values measured for each memory device in the system.

12 Claims, 4 Drawing Sheets

TECHNIQUES FOR STORING ACCURATE OPERATING CURRENT VALUES

BACKGROUND OF THE INVENTION

1. Field of the Invention

The present invention relates generally to memory subsystems and, more specifically, to a technique for storing accurate operating current values using programmable elements on memory devices.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

In today's complex computer systems, speed, flexibility, and reliability in timing and control are issues typically considered by design engineers tasked with meeting customer requirements while implementing innovations which are constantly being developed for computer systems and their components. As system technology advances and processing and data access speeds continue to increase, design engineers are faced with a variety of ever-changing design challenges.

Computer systems generally include one or more central processing units (CPUs), such as microprocessors, which generally control system functions and facilitate the processing of system requests. The CPU(s) is coupled to the system memory which generally includes volatile memory, such as random access memory (RAM). The system memory may be implemented to store programs and data which may be accessible to other system components, such as processors or peripheral devices, while the computer system is powered-on. Typically, the memory devices in the system memory are grouped together to form memory modules, such as dual-inline memory modules, where the memory devices are electrically coupled together through one or more buses on the memory module. Computer systems may incorporate numerous memory modules to increase the storage capacity of the system.

The computer system may also include a segment of non-volatile memory, such as read-only memory (ROM), which may store the basic input/output system (BIOS). The system BIOS may be implemented to load the operating system into the system memory, and to generally configure the system in accordance with the current system resources and topology.

Typically, computer device manufacturers design system devices, such as processors and memory devices, to operate within a predetermined temperature range. If the temperature exceeds the predetermined range (i.e., the device becomes too hot), the device may not function properly (if at all), thereby potentially degrading the overall performance of the computer system. Accordingly, it is desirable for a computer system and its components to operate within a thermally benign environment.

As can be appreciated, the electrical devices of the computer system, such as the processors and memory devices, draw electrical current to perform their intended functions. Typically, any electrical device through which electrical current flows produces heat. The amount of heat that any one device generates is generally a function of the amount of current flowing through the device. Typically, the faster an electrical component is operating, the more heat that is produced by the component. Accordingly, with the increased processing speeds and data access rates of today's computer systems, component heat production may become more of a consideration in system designs. This may be particularly true for memory devices.

One technique for cooling memory devices may be referred to as "passive" cooling or system "throttling." Throttling refers to reducing the operating speed of a component so that less current flows through the component such that the component produces less heat. Systems may be equipped with monitoring devices that are configured to monitor the temperature of system components, such as memory devices. If a memory device exceeds a threshold temperature, the access rate to that particular memory device may be reduced, for instance. Disadvantageously, implementing thermal monitoring devices on each system component may be difficult and expensive.

Accordingly, memory devices may be accompanied by data sheets that include operating currents for the devices operating in various modes and over various environmental conditions. The operating currents ($I_{DD}$) provide general ranges that may be implemented to set thresholds in the system, such that the devices may be monitored to ensure that they do not exceed the recommended operating currents. As can be appreciated, the operating currents may be correlated with the processing/access speed of the memory device. By setting thresholds based on operating currents provided in the data sheets, the system may be configured to reduce the access rate, and thereby reduce the operating current to mitigate the potential for the memory device becoming too hot.

Because data sheets are typically correlated with a particular type of memory chip, the operating currents provided on the data sheets generally account for the worst case scenarios for a particular type of memory. That is to say that data sheets include operating currents that are limited by those devices with the fastest failure rate. In practice, many of the memory devices can operate at currents of 15–40% outside of those provided on the data sheets. Accordingly, by configuring a computer system to reduce access rates based on operating currents provided on the data sheets, the memory devices are not being implemented to the full extent of their capabilities.

The present invention may address one or more of the problems set forth above.

BRIEF DESCRIPTION OF THE DRAWINGS

Advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
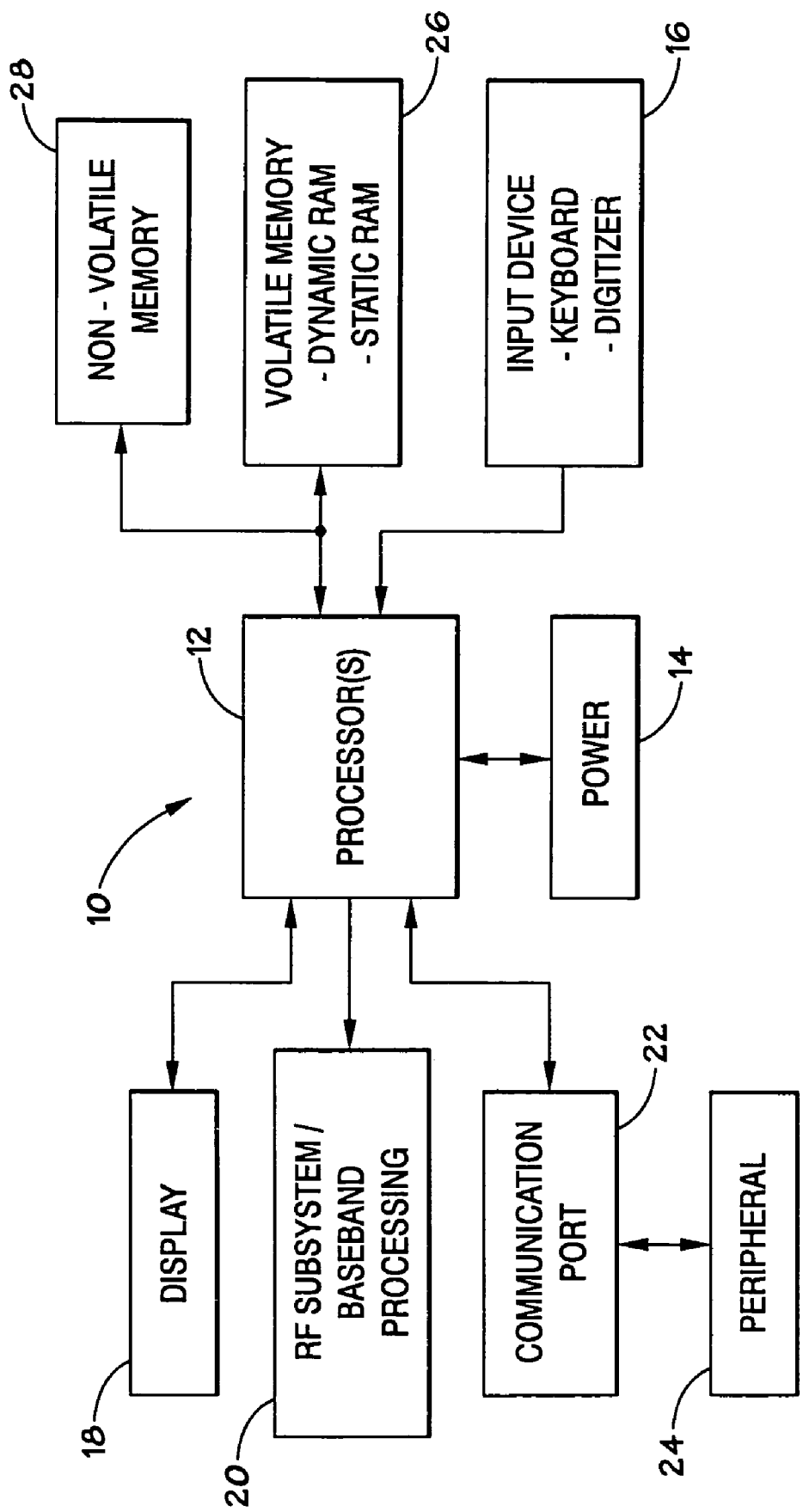
FIG. 1 illustrates a block diagram of an exemplary processor-based device in accordance with embodiments of the present invention.

Turning now to the drawings, and referring initially to FIG. 1, a block diagram depicting an exemplary processor-based system, generally designated by reference numeral 10, is illustrated. The system 10 may be any of a variety of types such as a computer, pager, cellular phone, personal organizer, control circuit, etc. In a typical processor-based device, one or more processors 12, such as a microprocessor, controls the processing of system functions and requests in the system 10. As will be appreciated, the processor 12 may include an embedded North or South bridge, for coupling each of the aforementioned components thereto. Alternatively, the bridges (not shown) may include separate bridges coupled between the processor 12 and the various components of the system 10.

The system 10 typically includes a power supply 14. For instance, if the system 10 is a portable system, the power supply 14 may advantageously include permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance. Various other devices may be coupled to the processor 12 depending on the functions that the system 10 performs. For instance, a user interface 16 may be coupled to the processor 12. The user interface 16 may include buttons, switches, a keyboard, a light pen, a mouse, and/or a voice recognition system, for instance. A display 18 may also be coupled to the processor 12. The display 18 may include an LCD display, a CRT, LEDs, and/or an audio display, for example. Furthermore, an RF sub-system/baseband processor 20 may also be couple to the processor 12. The RF sub-system/baseband processor 20 may include an antenna that is coupled to an RF receiver and to an RF transmitter (not shown). One or more communication ports 22 may also be coupled to the processor 12. The communications port 22 may be adapted to be coupled to one or more peripheral devices 24 such as a modem, a printer, a computer, or to a network, such as a local area network, remote area network, intranet, or the Internet, for instance.

Because the processor 12 generally controls the functioning of the system 10 by implementing software programs, the memory is operably coupled to the processor 12 to store and facilitate execution of various programs. For instance, the processor 12 may be coupled to the volatile memory 26 which may include Dynamic Random Access Memory (DRAM) and/or Static Random Access Memory (SRAM). The volatile memory 26 may include a number of memory modules, as described further below. As can be appreciated, the volatile memory 26 may simply be referred to as the "system memory." The volatile memory 26 is typically quite large so that it can store dynamically loaded applications and data.

The processor 12 may also be coupled to non-volatile memory 28. The non-volatile memory 28 may include a read-only memory (ROM), such as an EPROM, and/or flash memory to be used in conjunction with the volatile memory. The size of the ROM is typically selected to be just large enough to store any necessary operating system, application programs, and fixed data. Additionally, the non-volatile memory 28 may include a high capacity memory such as a tape or disk drive memory.

Figure 2:
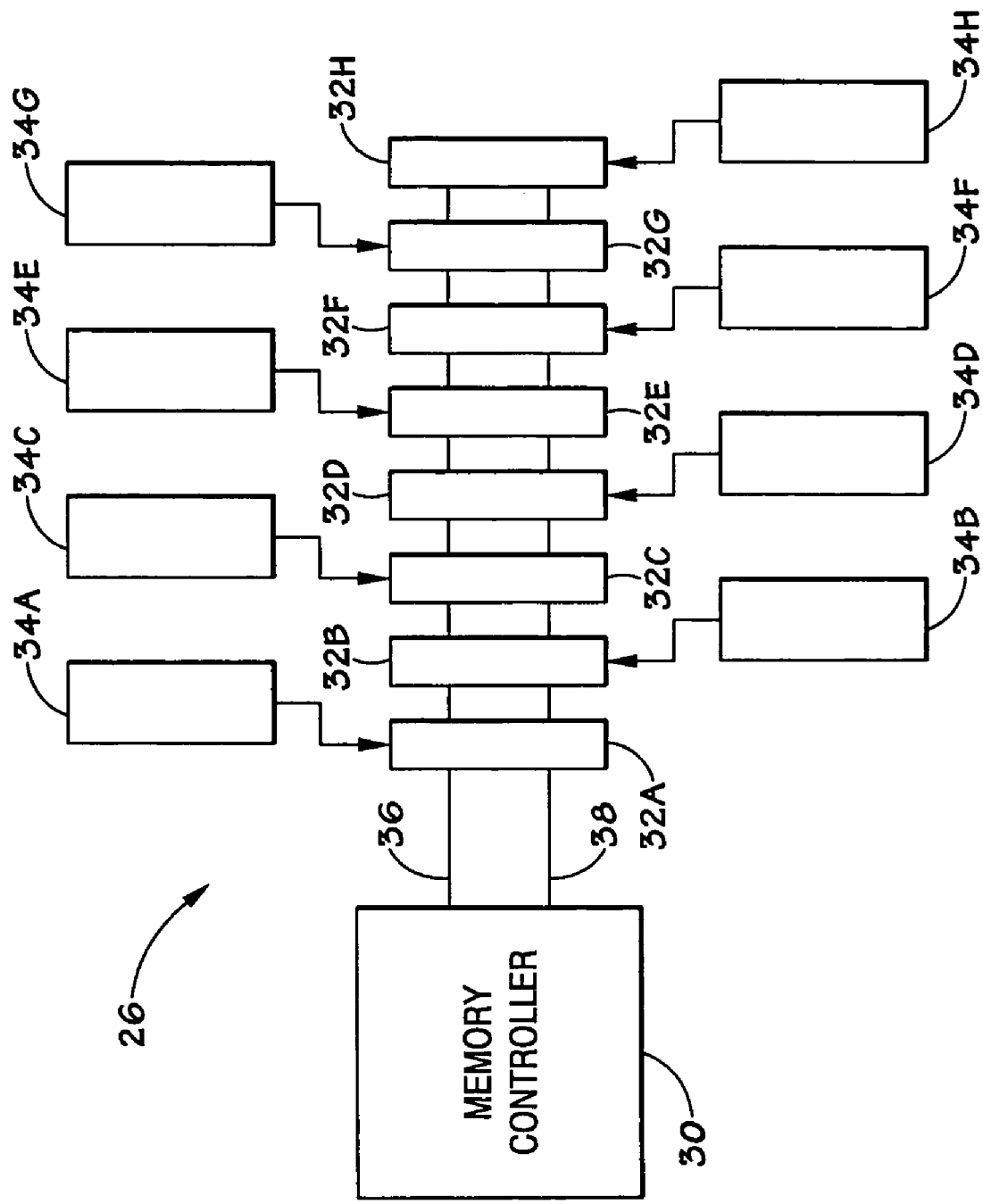
FIG. 2 illustrates an exemplary memory sub-system in accordance with embodiments of the present invention.

FIG. 2 generally illustrates a block diagram of a portion of a memory sub-system, such as the volatile memory 26. A memory controller 30 is generally provided to facilitate access to the storage devices in the system memory. While the present embodiment illustrates the memory controller 30 as existing in the memory sub-system, the memory controller 30 may be in the processor 12 or may exist in a discrete chip, as can be appreciated by those skilled in the art. The memory controller 30 may receive requests to access the memory devices via one or more processors, such as the processor 12, via peripheral devices, such as the peripheral device 24, and/or via other systems. The memory controller 30 is generally tasked with facilitating the execution of the requests to the memory devices and coordinating the exchange of information, including configuration information, to and from the memory devices.

The volatile memory 26 may include one or more connectors or slots 32A–32H that are each configured to operably couple a respective memory module 34A–34H, such as a dual-inline memory module (DIMM), to the memory controller 30 via one or more memory buses. Each memory module 34A–34H generally includes one or more memory devices such as dynamic random access memory (DRAM) devices capable of storing data. The memory buses may include a data bus 36 to facilitate the exchange of data between each memory device and the memory controller 30. The data bus 36 may comprise a plurality of single bit data buses each coupled from the memory controller 30 to an individual memory device. In one exemplary embodiment of the volatile memory 26, the memory data bus 36 may include 64 individual data buses. In other words, the exemplary data bus 36 may have a width of 64 bits. In this exemplary embodiment, each of the eight memory slots 32A–32H is capable of supporting a memory module 34 comprising eight memory devices. Further, the data bus 36 may include one or more individual buses to each memory slot 32A–32H which may be used for ECC error detection and correction. Further, one or more of the devices on the memory modules 34A–34E may be implemented for parity data storage. As can be appreciated by those skilled in the art, aspects of the data bus 36 will vary depending on the configuration and capabilities of the system 10.

The volatile memory 26 may also include a command bus 38 on which address information such as command address (CA), row address select (RAS), column address select (CAS), write enable (WE), bank address (BA), and chip select (CS), for example, may be delivered for a corresponding request. Further, the command bus 38 may also be used to facilitate the exchange of configuration information at system boot. As with the data bus 36, the command bus 38 may comprise a plurality of individual command buses. In the present exemplary embodiment, the command bus may include 20 individual buses. Accordingly, the present exemplary command bus may have a width of 20 bits. As previously explained with reference to the data bus 36, a variety of embodiments may be implemented for the command bus 38 depending on the system configuration.

Figure 3:
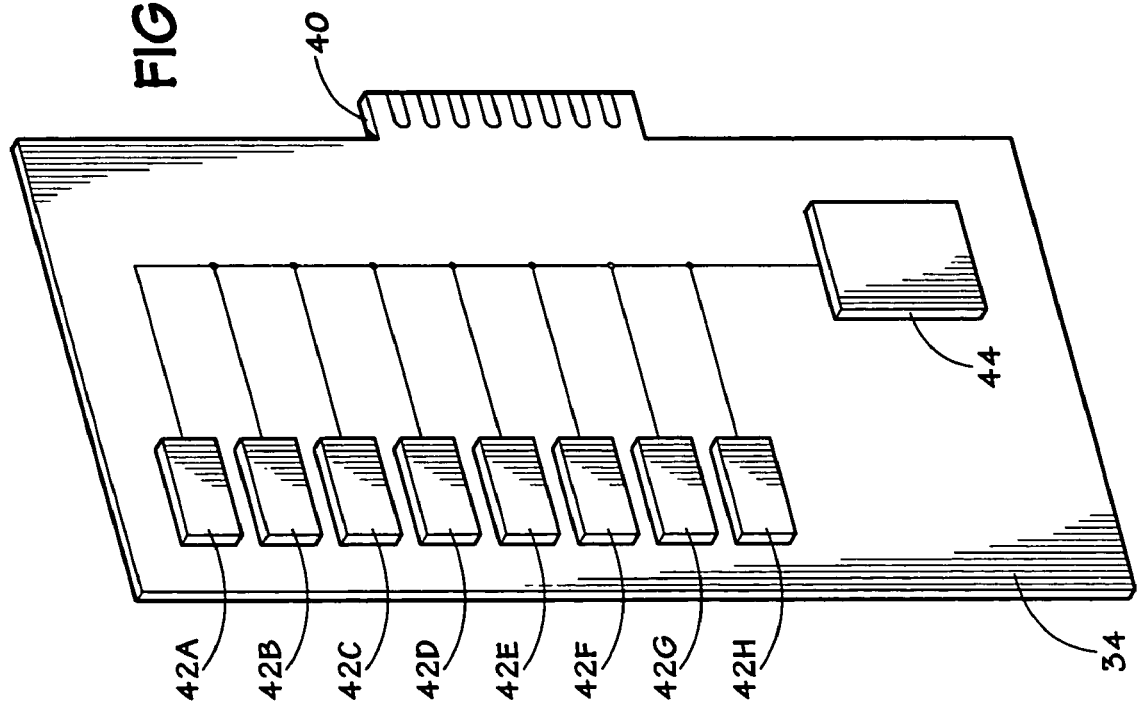
FIG. 3 illustrates an exemplary memory module in accordance with embodiments of the present invention.

FIG. 3 illustrates an exemplary memory module 34, such as a DIMM, that may be inserted in one of the memory slots 32A–32H. The memory module 34 may include an edge connector 40 to facilitate mechanical coupling of the memory module 34 into a memory slot 32A–32H. Further, the edge connector 40 provides a mechanism for facilitating the exchange of data and control signals from the memory controller 30 to devices on the memory module 34. The memory module 34 may include a plurality of volatile memory devices 42A–42H, such as dynamic random access devices (DRAMs), which may be used for storing information. Alternatively, rather than an edge connector 40, the memory module 34 may include another type of contact means, such as a connector generally located in an area of the memory module 34 other than edge (e.g., center).

Each memory module 34 may also include a non-volatile memory device 44 to store information corresponding to the respective memory module 34 and memory devices 42A–42H on the memory module 34, such as device size, speed, operating voltages and timing parameters, for instance. The non-volatile memory device 44 on each memory module 34 may be accessed by the system BIOS at system boot to properly configure the system to fit the particular performance profiles of the memory devices 42A–42H on the corresponding memory module 34. One such non-volatile memory device 44 is a serial presence detect (SPD). An SPD device is typically an eight-pin, non-volatile, read only, serial chip which stores information about the memory module 34 including, but not limited to, the module size, speed, voltage, drive strength, and the number of row and column addresses. At system boot, the Basic Input/Output System (BIOS) reads the parameters stored on the SPD and automatically configures the system chipset to maximize reliability and system performance. If timing parameters are not adjusted during the system boot, the system 10 may produce more errors and/or operate at non-optimal speeds.

In accordance with one exemplary embodiment, each memory device 42A–42H includes a plurality of programmable units 46A–46H, respectively. Each of the plurality of programmable units 46A–46H may comprise a non-volatile storage device such as an antifuse, for example. As can be appreciated, antifuses are non-volatile memory elements that function as open circuits until they are programmed. When programmed, an antifuse creates a short circuit or low resistance link. Antifuses may, for example, be used to implement redundancy rows and columns in a memory device or as a mechanism for changing an operating mode. Antifuses may also be programmed to encode information. In the present exemplary embodiment, the plurality of programmable units 46A–46H, such as antifuses, may be implemented to store operating current parameters/values for a respective memory device 42A–42H to optimize system performance, as described further below. Alternatively, fuses may be implemented to store the operating current parameters/values.

After fabrication, memory devices, such as the memory devices 42A–42H are generally tested and characterized such that the memory devices 42A–42H are defined to operate optimally within particular ranges for particular instructions and over a specified range of conditions. One such test parameter is operating current. As previously described, operating current parameters or values are generally provided on data sheets, such that a system may be configured to operate within the operating current parameters. Operating current parameters may be provided for a number of conditions. As can be appreciated, the operating current parameters may be derived from testing a number of memory devices over a range of operating conditions (e.g., speeds, temperatures, etc.). As previously described, the faster the memory device is accessed, the higher the operating current and the more likely that the functionality of the memory device may fail due to the high temperature of the memory device caused by the high operating speeds. Accordingly, operating current parameters can function as guidelines for optimizing the functionality of the memory device 42A–42H, and a system 10 may be configured to operate such that the maximum operating current parameters are not exceeded during operation of the system 10.

Generally speaking, operating current parameters are provided for a particular type of memory device, such as a static random access memory (SDRAM) device or a double data rate synchronous dynamic random access memory (DDR SDRAM) device, for example. To ensure that a large majority of the memory devices 42A–42H function properly within the ascribed operating currents, the operating current parameters provided on the data sheets provide worst-case current values. While this may ensure that the majority of the memory devices 42A–42H will function properly (i.e., will not exceed recommended operating temperatures), it does not ensure that the memory devices 42A–42H are operating optimally, because the operating current parameters are generally set in accordance with the memory devices 42A–42H having the lowest acceptable test performance. By providing device specific operating current values with each memory module 34, system performance may be optimized in accordance with the particular memory devices 42A–42H being implemented, as described further below.

Figure 4:
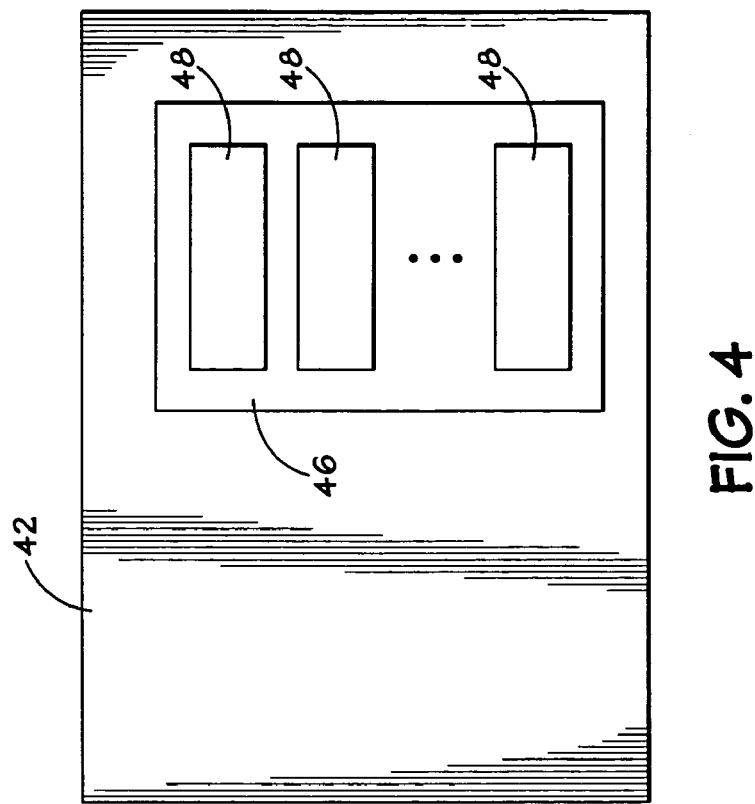
FIG. 4 illustrates an exemplary volatile memory device in accordance with embodiments of the present invention.

Turning now to FIG. 4, a block diagram of an exemplary memory device 42 is illustrated. The memory device 42 includes a plurality of programmable elements 48, collectively illustrated and referenced by the reference numeral 46. For clarity, references to the programmable units 46 or 46A–46H, generally refer to a bank or plurality of individual programmable elements 48. That is to say that each programmable unit 46 or 46A–46H generally comprises a plurality of individual programmable elements 48. Each of the programmable elements 48 may be a non-volatile storage device, such as an antifuse, for example. The programmable elements 48 may be implemented to encode each memory device 42 with operating current ($I_{DD}$) values correlative to the optimized functionality of the particular memory device 42. Accordingly, each memory device 42 that may be incorporated into a memory module 34 (FIG. 3) includes device-specific operating currents which may be used to configure a system 10 (FIG. 1), as described further below.

Figure 5:
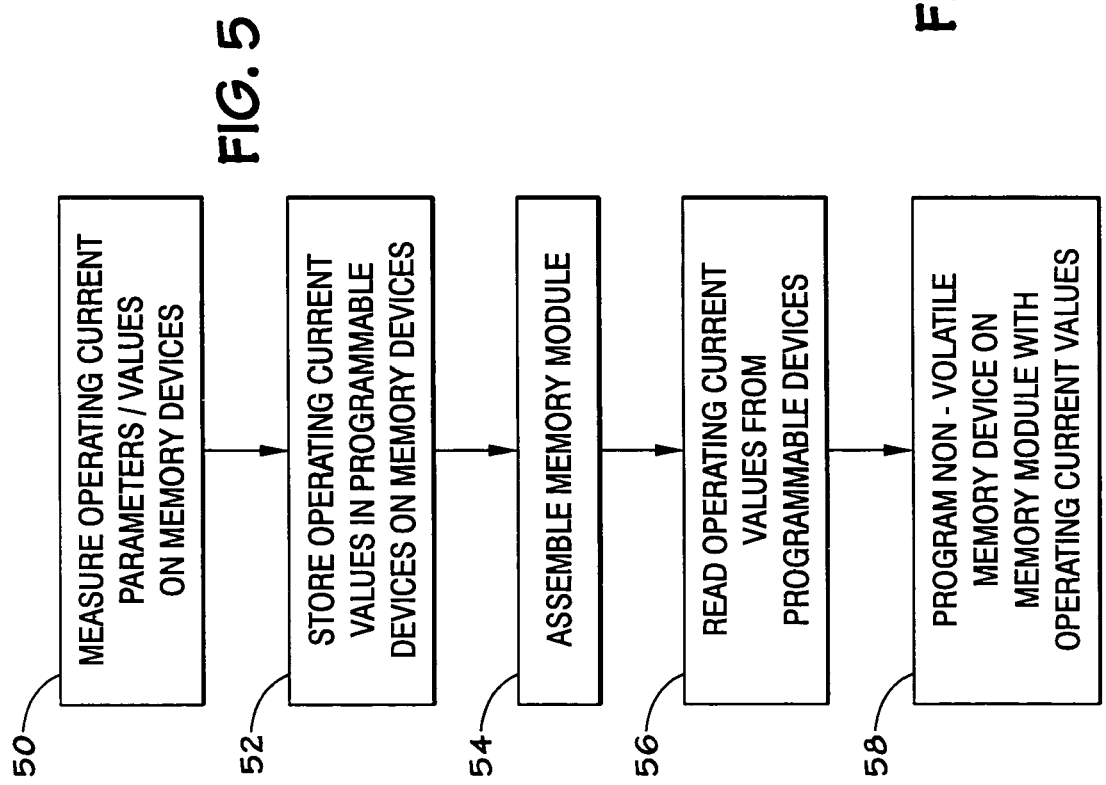
FIG. 5 is a flow chart illustrating exemplary methods for fabricating memory modules in accordance with embodiments of the present invention.

Referring now to FIG. 5, exemplary methods for fabricating a memory module 34 in accordance with embodiments of the present invention are illustrated. During manufacturing of the memory devices 42A–42H or during the manufacturing of the memory modules 34, the operating current ($I_{DD}$) values for each of the memory devices 42A–42H may be measured, as indicated in block 50. As previously described, operating current parameters are generally provided for a memory type, rather than for each specific memory device 42A–42H. In one exemplary embodiment, the operating current values measured for each specific memory device 42A–42H may be implemented to better optimize performance of the system 10, as described further below.

After measuring the operating current values, the operating current values corresponding to a each respective memory device 42A–42H are stored in the programmable elements 48 on the respective memory device 42A–42H, as indicated in block 50. Accordingly, each memory device 42A–42H includes a plurality of programmable elements 48 which have been programmed to store the measured operating current values associated with the corresponding memory device 42A–42H. After storing the operating current values on the corresponding memory device 42A–42H, the memory devices 42A–42H are assembled to form a memory module 34, as indicated in block 54. Advantageously, after incorporating the memory module 34 into a system 10 (FIG. 1), the memory devices 42A–42H may be accessed such that the operating current parameters stored on the programmable elements 48 may be implemented to optimize performance of the system 10, as described further below with respect to FIG. 6.

As previously described, each memory module 34 may also include a non-volatile memory device 44, such as an SPD which may be implemented to store information corresponding to the respective memory module 34 and memory devices 42A–42H on the memory module 34, such as device size, speed, operating voltages and timing parameters, for instance. In one exemplary embodiment, the non-volatile memory device 44 may also be implemented to store the measured operating current values for each of the memory devices 42A–42H on the memory module 34. Accordingly, in one exemplary embodiment, after assembly of the memory module 34, the operating current values may be read from the programmable elements 48, as indicated in block 56 of FIG. 5. The non-volatile memory device 44 may be programmed to store the operating current values read from each of the programmable elements 48, such that the non-volatile memory device 44 includes the operating currents for each of the memory devices 42A–42H on the memory module 34, as indicated in block 58. Advantageously, because systems, such as the system 10 (FIG. 1), are generally configured to access the non-volatile memory device 44 to configure the system 10 in accordance with the device parameters of the memory module 34, the inclusion of the operating current values on the non-volatile memory device 44 may be easily incorporated into configuration of the system 10.

As can be appreciated, the order of the acts described with reference to FIG. 5 is meant by way of example and for purposes of illustration only. Accordingly, the acts may be performed in an order that differs from the order illustrated in the exemplary flow chart.

Figure 6:
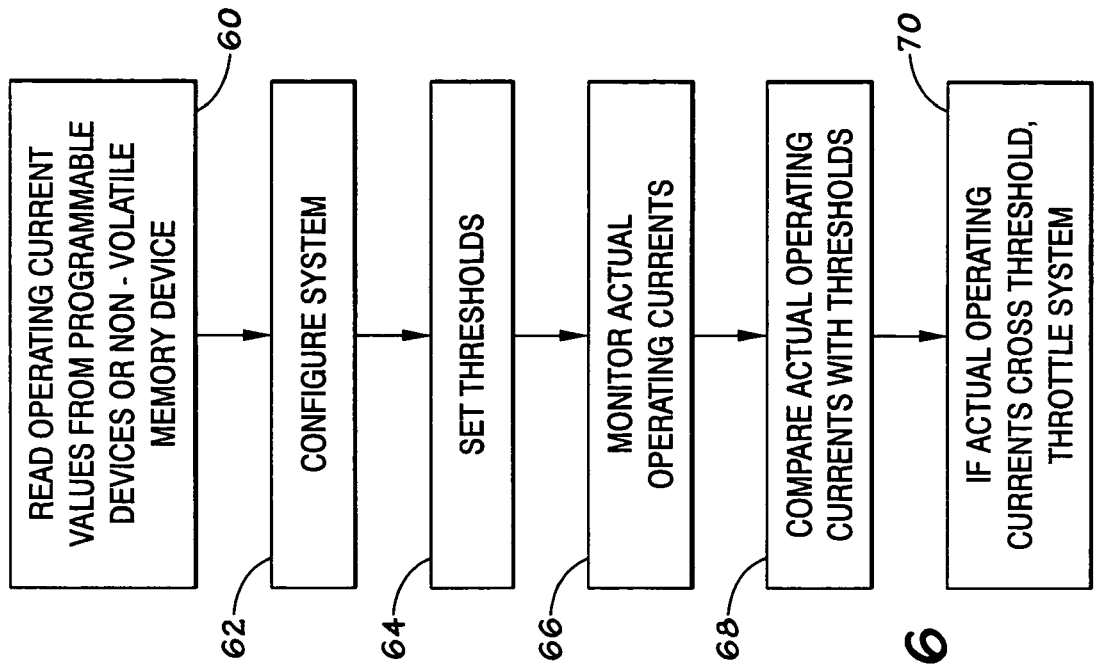
FIG. 6 is a flow chart illustrating exemplary methods for configuring a system incorporating memory modules fabricated in accordance with embodiments of the present invention.

FIG. 6 illustrates exemplary methods for configuring a system incorporating memory modules fabricated in accordance with embodiments of the present invention. As can be appreciated, the exemplary configuration techniques may be used in a system 10 that implements memory modules 34 having memory devices 42A–42H with programmable elements 48 implemented for storing operating current values for the memory devices 42A–42H. Further, as described above with reference to FIG. 5, a non-volatile memory device 44, such as an SPD, may also be implemented to store the operating current values corresponding to the memory devices 42A–42H. To configure the system 10 for optimized utilization of the memory devices 42A–42H, the operating current values are read from the non-volatile memory device 44, or directly from the programmable elements 48 on each memory device 42A–42H, as indicated in block 60 of FIG. 6. In one exemplary embodiment, the operating current values are read by the BIOS during system boot.

Once the operating current values are read from the non-volatile memory device 44 or the programmable elements 48, the system 10 can be configured to operate in accordance with the operating current values, as indicated in block 62. That is to say that configuration registers in the system 10 may be set based on the operating current limitations for the particular memory devices 42A–42H being implemented in the system 10. For instance, in one embodiment, the operating current values read from the non-volatile memory device 44 or the programmable elements 48 may be used to set operating current thresholds for the system 10, as indicated in block 64. By setting operating current thresholds in the system 10 based on the operating current values stored on the non-volatile memory device 44 or the programmable elements 48, access rates to memory devices 42A–42H can generally be increased. As previously described, once operating currents reach the thresholds, access rates may be reduced to insure that the memory device 42A–42H does not overheat by drawing too much current. If the thresholds are set using the worst-case values provided on the data sheets, access rates may be prematurely reduced. That is to say that if the worst-case operating currents are implemented to establish thresholds for throttling a memory devices 42A–42H or the memory module 34, performance capabilities may be wasted if the specific memory devices 42A–42H in the system 10 can operate accurately at operating currents above the worst-case values provided on the data sheets.

Once the operating current thresholds are set in the system 10 using the values stored on the non-volatile memory device 44 or the programmable elements 48, the actual operating current of each memory device 42A–42H may be monitored internally by the system 10, as indicated in block 66. During processing, the monitored operating currents may be compared to the thresholds set using the operating current values stored in the non-volatile memory device 44 or the programmable elements 48, as indicated in block 68. In one embodiment, the monitored currents may be continuously compared to the thresholds. In another embodiment, the monitored currents may be compared to the thresholds periodically, based on a number of clock cycles, for instance. As can be appreciated, if the monitored operating current crosses the threshold, the access rate to the corresponding memory device 42A–42H or memory module 34 can be reduced (i.e., the system 10 may be throttled). By implementing the present techniques, the operability of the memory devices 42A–42H may be optimized, thereby improving the overall performance of the system 10.

While the present exemplary embodiments illustrate the advantages of measuring and storing device specific operating current values in the programmable elements 48, other parameters, such as voltage or timing parameters, may also be measured on a particular memory device 42A–42H and advantageously stored in the programmable elements 48. As described above with regard to the operating currents, any parameters for a specific memory device 42A–42H may be measured and stored in the programmable elements 48 from later use, such as for programming the non-volatile memory device 44 (block 56). These parameters may be used to set thresholds and otherwise optimize performance of the memory device 42A–42H and the system 10 in general.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A memory module comprising:
   a substrate; and
   a plurality of memory devices coupled to the substrate, wherein each of the plurality of memory devices comprises a respective plurality of programmable elements and wherein a respective operating current value for each of the plurality of memory devices are stored in the respective plurality of programmable elements.

2. The memory module, as set forth in claim 1, comprising a non-volatile memory device coupled to the substrate, wherein a respective operating current value for each of the plurality of memory devices are stored in the non-volatile memory device.

3. The memory module, as set forth in claim 2, wherein the non-volatile memory device comprises a serial presence detect device.

4. The memory module, as set forth in claim 1, wherein the memory module comprises a dual inline memory module.

5. The memory module, as set forth in claim 1, wherein each of the plurality of memory devices comprises a dynamic random access memory device.

6. The memory module, as set forth in claim 1, wherein each of the plurality of programmable elements comprises an antifuse.

7. A system comprising:
   a processor; and
   a memory module coupled to the processor and comprising:
      a substrate; and
      a plurality of memory devices coupled to the substrate, wherein each of the plurality of memory devices comprises a respective plurality of programmable elements and wherein a respective operating current value for each of the plurality of memory devices are stored in the respective plurality of programmable elements.

8. The system, as set forth in claim 7, comprising a non-volatile memory device coupled to the substrate, wherein a respective operating current value for each of the plurality of memory devices are stored in the non-volatile memory device.

9. The system, as set forth in claim 8, wherein the non-volatile memory device comprises a serial presence detect device.

10. The system, as set forth in claim 7, wherein the memory module comprises a dual inline memory module.

11. The system, as set forth in claim 7, wherein each of the plurality of memory devices comprises a dynamic random access memory device.

12. The system, as set forth in claim 7, wherein each of the plurality of programmable elements comprises an antifuse.

* * * * *